OPERATIONAL AMPLIFIER WITH MODE CONTROL SWITCHES

Filed Dec. 10, 1965 2 Sheets-Sheet 1

INVENTOR.
MONROE A. MILLER
BY Christie, Parker & Hale
ATTORNEYS

OPERATIONAL AMPLIFIER WITH MODE CONTROL SWITCHES

Filed Dec. 10, 1965 2 Sheets-Sheet 2

INVENTOR.
MONROE A. MILLER
BY Christie, Parker & Hale
ATTORNEYS

United States Patent Office 3,374,362

Patented Mar. 19, 1968

3,374,362

OPERATIONAL AMPLIFIER WITH MODE CONTROL SWITCHES

Monroe A. Miller, Coral Gables, Fla., assignor to Milgo Electronic Corporation, Miami, Fla., a corporation of Florida Filed Dec. 10, 1965, Ser. No. 512,961
16 Claims. (Cl. 307—230)

Figure 1:
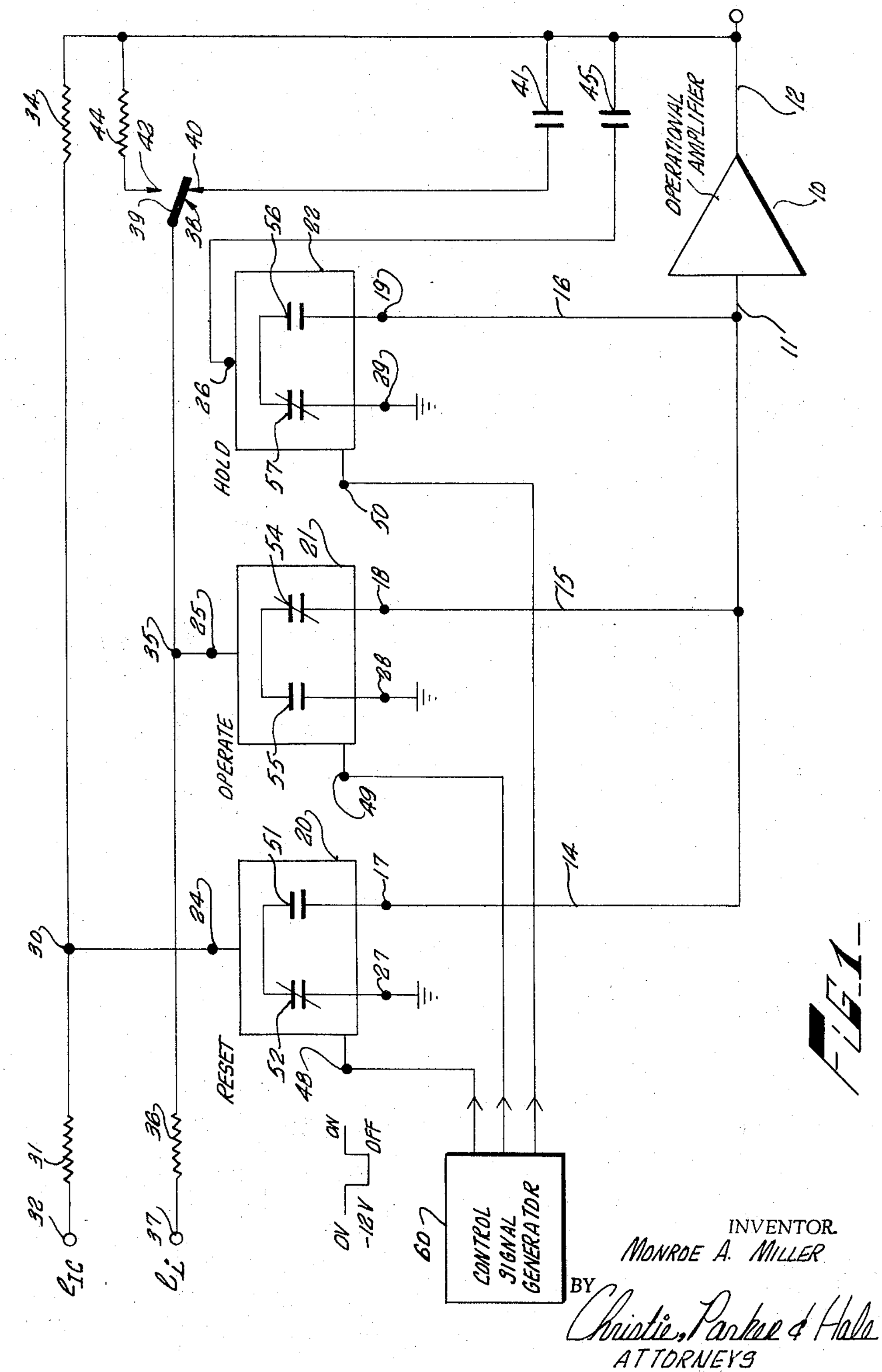

This invention relates to operational amplifiers and more particularly to the use of high speed solid state switches in operational amplifier circuits.

The operational amplifier is particularly useful in analog computers for obtaining the integral of an input signal, the sum of several input signals and performing other desired functions on one or more input electrical signals. In performing various operations with operational amplifiers to solve problems in an analog computer it is generally necessary to switch the input circuit of the amplifier between one of several input signals. For example, a signal representative of an initial condition of the problem to be solved may first be applied to the input circuit of the amplifier. An input signal which is to be integrated, etc. is then applied to the input circuit of the operational amplifier. If desired, the input circuit of the operational amplifier may be switched into a "hold" position to store the value of the output signal. The input circuit of the operational amplifier may then be reconnected to the input signal to continue the solution of the problem.

Two or more modes of operation are necessary for operational amplifiers used in an analog computer. The amplifier is placed in the "reset" mode to receive the initial condition signal and it is placed in the "operate" mode to receive the input signal. The "hold" mode of operation may be desired only where the amplifier is adapted to function as an integrator.

Operational amplifiers have been switched from one mode of operation to another in the past by use of relays as well as solid state switches. Solid state switches are much faster than relays, however, the use of solid state switches in the past for controlling the mode of operation of an operational amplifier has created certain problems.

Solid state switches such as transistors have a higher impedance than conventional relays in the closed circuit or conducting state. To eliminate the effect of the impedance in the conducting state transistor switches must be placed inside the feedback loop or between the input circuit of the operational amplifier and a summing junction. When connected in this manner the impedance of the switch does not affect the currents at the summing junction and thus does not introduce an error in the output voltage. A separate summing junction must be provided for each mode of operation of the amplifier when solid state switches are employed because each switch is associated with a separate summing junction. The feedback circuit of a high gain operational amplifier is essential for the stability of the amplifier. For this reason it is necessary to always have one feedback circuit connected to the input of the amplifier. Without a feedback circuit the amplifier will saturate due to noise signals generated within the amplifier.

Where solid state switches are used for mode control it is also necessary to accurately ground the summing junction of the feedback circuit which is not connected to the amplifier input. To permit even a small voltage to appear at the summing junctions which are not connected to the amplifier input circuit will provide an error in the output signal proportional to the impedance across the nonconducting switches.

It is also necessary to prevent the amplifier input circuit from being connected to ground because this will change the output voltage of the amplifier. If the output voltage of the amplifier, for example, has been set at the initial condition signal or has been held at a previously acquired signal by the hold mode then a temporary grounding of the input circuit causes a loss of the signal and may invalidate the problem solution. Various other inherent characteristics of solid state switches may be compensated for to provide an accurate operational amplifier circuit as discussed in more detail in the description.

In accordance with the present invention, an operational amplifier is provided with an input and an output circuit. First and second amplifier input terminals are provided for receiving input signals such as an initial condition signal and a time variable signal to be selectively applied to the amplifier input circuit. At least two mode control switches are provided for controlling the mode of the operation of the amplifier. Each mode control switch has an input terminal, first and second output terminals and a control terminal and is arranged to selectively connect the input terminal thereof to the first and second output terminals in response to the application of first and second control signals, respectively, to the control terminal. The first output terminal of each of the switches is connected to the input of the amplifier and the second output terminal of each switch is connected to ground potential. A feedback impedance is individually connected between the amplifier output circuit and the input terminal of each switch. An input impedance is connected between each of the amplifier input terminals and the input terminal of the respective mode selector switch. Means are provided for applying a first control signal to a selected mode control switch and the second control signal to the other mode control switch and for simultaneously applying the first control signal to the control terminals of two of the switches during the transition time when the input terminals of the two switches are being disconnected from one of the output terminals and connected to the other output terminal so that the input circuit of the amplifier is always connected to the input terminals of at least one switch.

In the preferred embodiment each mode control switch includes a first transistor connected between the input terminal of the switch and the amplifier input circuit and a second transistor connected between the switch input terminal and ground. In this preferred embodiment means are coupled to the first and second transistors of each switch for rendering the second transistor in its nonconducting state and subsequently the first transistor in its conducting state in response to the first control signal and for rendering the first transistor in its nonconducting state and subsequently the second transistor in its conducting state in response to the second control signal. This prevents the input terminal of the amplifier from being grounded. Additional means may be provided for compensating for leakage currents and capacitance effects of the transistors in the nonconducting state and during the switching time to greatly minimize the transient noise signals applied to the amplifier input circuit.

Figure 2:
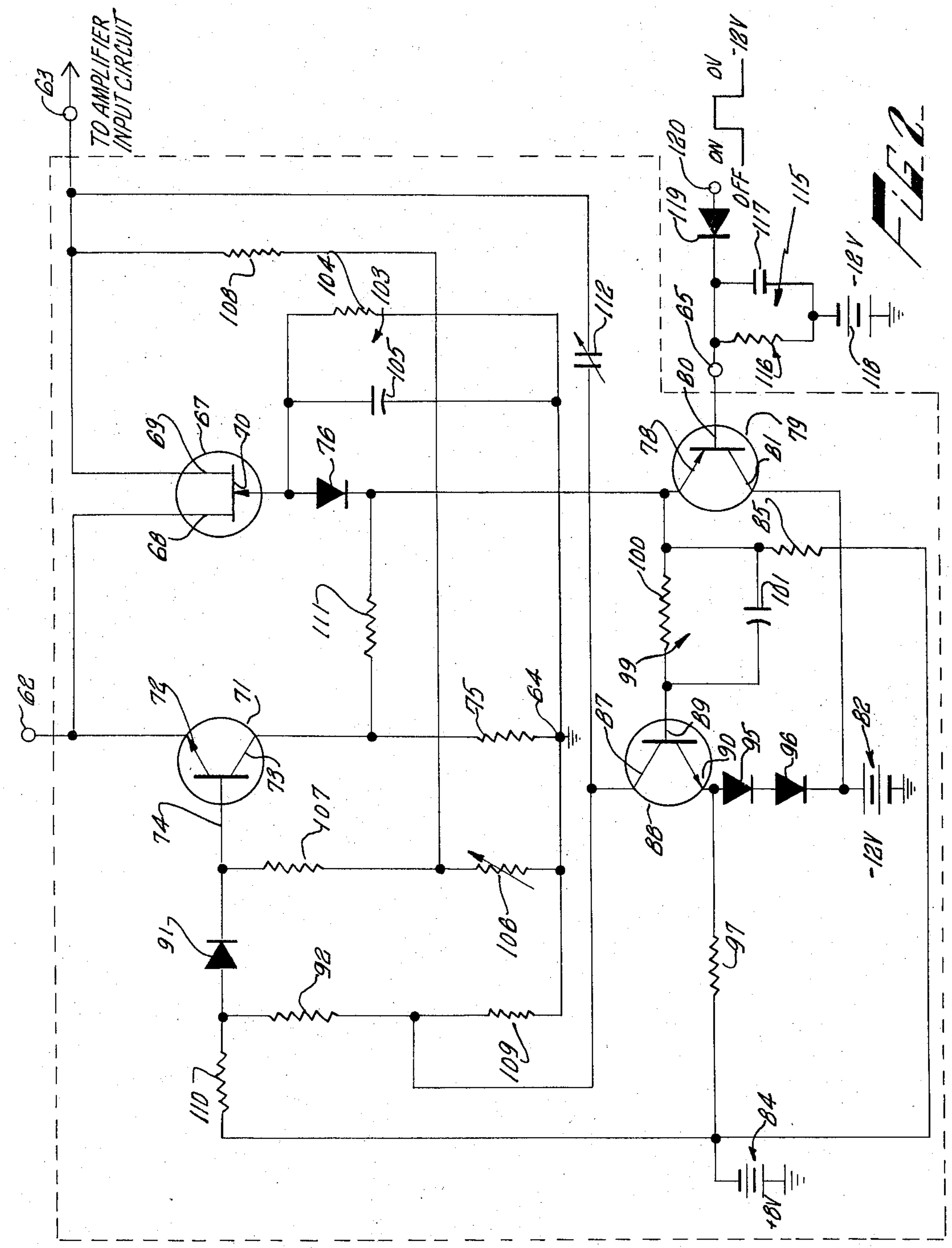

The novel features which are believed to be characteristic of the invention, both as to its organization and method of operation together with the further advantages thereof will be better understood from the following description considered in connection with the accompanying drawings in which:

FIG. 1 is a block diagram of an operational amplifier circuit embodying the principal of the present invention; and FIG. 2 is a schematic circuit diagram of one of the mode control switches shown in FIG. 1.

Referring now to FIG. 1, an operational amplifier 10 is provided with an input circuit 11 and an output circuit 12.

The output voltage $e_o$ from the amplifier is established in the output circuit 12 and is referenced to ground potential. It should be understood that the term "ground potential" as used herein designates the reference potential for the amplifier and need not represent ground potential for associated equipment.

The input circuit 11 of the operational amplifier is connected to three parallel leads 14, 15 and 16 which are connected to the first output terminals 17, 18 and 19, respectively, of mode control switches 20, 21 and 22. The mode control switches are provided with input terminals 24, 25 and 26, as shown in FIG. 1. The mode control switches are also provided with second output terminals 27, 28 and 29, respectively, which are connected to ground potential. The mode control switches are designated reset, operate and hold as shown in FIG. 1. The input terminal 24 of the reset mode control switch is connected to a summing junction 30. A resistor 31 is connected between the summing junction 30 and a first input terminal 32 for the amplifier circuit which is arranged to receive a voltage signal $e_{ic}$ representative of the initial condition for the particular problem to be solved by the amplifier 10. A first feedback resistor 34 is connected between the summing junction 30 and the output circuit of the amplifier 12.

The input terminal 25 of the operate mode control switch is connected to a second summing junction 35. A resistance 36 is connected between the summing junction 35 and the second input terminal 37 of the amplifier circuit which is adapted to receive the input voltage $e_i$ to be amplified or integrated by the amplifier 10 during the operate or problem solution mode. The input signal $e_i$ will generally be a time variable signal.

A relay switch of the single pole double throw type 38 includes a movable contact 39 connected to the summing junction 35. The movable contact 39 connects the summing junction 35 through a first fixed contact 40 and a feedback capacitance 41 to the amplifier output circuit 12. In this mode of operation the amplifier 10 operates as an integrating circuit for providing an output signal $e_o$ proportional to the time integral of the input signal $e_i$. The relay 38 also includes a second fixed contact 42 which is connected through a feedback resistor 44 to the amplifier output circuit 12. When the relay 38 is operated to connect the summing junction 35 to the contact 42, the amplifier 10 operates as an amplifier circuit to amplify the input signal $e_i$. Additional input signals can be connected in parallel with associated resistors to the summing junction 35 to provide an output signal from the amplifier which is proportional to the sum of such input signals in a well known manner. Only one input signal $e_i$ is shown for simplicity.

The mode control switches include two solid state switching elements which are arranged to switch the input terminal to one of the two output terminals thereof in response to the application of control signals to control terminals 48, 49 and 50 of the switches 20, 21 and 22 respectively. The mode control switches are identical and the detailed configuration of a switch is shown in FIG. 2.

The solid state or transistor switching elements of each mode control switch are illustrated merely as contact elements in FIG. 1 for simplicity. The reset mode control switch 20 includes a first transistor switching element 51 for connecting the input terminal thereof to the output terminal 17 and the input circuit of the amplifier when the transistor element 51 is at its conducting state. The reset mode control switch includes a second transistor switching element 52 for connecting the input terminal of the switch to the output terminal 27 thereof or to ground. The operate switch 21 includes transistor switching elements 54 and 55 and the hold switch 22 includes transistor switching elements 56 and 57 as shown in FIG. 1. A capacitor 45 is connected between the amplifier output circuit 12 and the input terminal 26 of the hold switch 22 to provide the feedback circuit in the hold mode. This capacitor stores a charge proportional to the amplified output voltage in the reset or operate mode. The charge is maintained in the hold mode to preserve the amplifier output voltage.

The switching elements are conditioned as illustrated in FIG. 1 to ground the input terminals of the reset and hold control switches and to connect the input of the operate mode control switch to the input circuit of the amplifier 10. In this mode the operational amplifier circuit is in its operate condition and integrates the input signal $e_i$ by means of the feedback capacitor 41.

A control signal generator 60 is provided for applying first and second control signals to the control terminals of each of the mode control switches as illustrated. The application of a first control signal (illustrated as a zero volt signal) activates a mode control switch to its on condition or connects the input terminal of the mode control switch to the amplifier input circuit. The second control signal (illustrated as a −12 volt signal) turns the mode control switch to its off position or connects the input terminal thereof to ground.

The control signal generator or means associated with each mode control switch as described more specifically in reference to FIG. 2 applies the first control signal to a selected mode control switch and the second control signal to the other mode control switch and simultaneously applies the first control signal to the control terminals of two of the switches during the transition time when the input terminals of the two switches are being reconnected to another output terminal so that the input circuit of the amplifier is always connected to the input terminal of at least one switch. This prevents the amplifier input circuit from being disconnected from a feedback circuit. If the amplifier input terminal is permitted to float, noise signals within the amplifier will produce a spurious output signal and may even cause the amplifier to saturate.

Referring now to FIG. 2 there is illustrated a mode control switch for use as the reset, operate and hold switches of FIG. 1. The mode control switch includes an input terminal 62, a first output terminal 63, a second output terminal 64 and a control terminal 65. It is to be understood that the input, output and control terminals of the switch of FIG. 2 coincide with the input, output and control terminals of the reset, operate and hold control switches of FIG. 1.

A first transistor switching element in the form of a field effect transistor 67 is arranged with its source electrode 68 connected to the input terminal 62 and its drain electrode 69 connected to the output terminal 63. A second transistor switching element 71 of the NPN junction type is arranged with its emitter electrode 72 connected to the input terminal 62 and the collector electrode 73 connected through a resistor 74 of low resistance to the output terminal 64 or ground. The first transistor switching element 67 serves to connect the input terminal 62 to the amplifier input circuit when the element is in its conducting state and the second transistor switching element 73 serves to connect the input terminal to ground in its conducting state.

The field effect transistor 67 includes a gate electrode 70 which is connected through a diode 76 to the emitter electrode 78 of a PNP junction transistor 79. As shown, the field effect transistor 67 has a gate electrode of the P junction type so that a negative signal applied to the gate will render the transistor nonconducting. The field effect transistor 67 is in its conducting state when the gate electrode 70 is permitted to follow the potential of the source and drain electrodes.

The driving transistor 79 which controls the operation of the field effect transistor includes a base electrode 80 connected to the control terminal 65 and a collector electrode 81 connected to a source of negative potential 82 designated as a −12 volt battery. The transistor 79 is arranged in an emitter follower configuration with the emitter electrode connected to a positive potential source 84 designated as a +8 volt battery through a load resistor 85. The base electrode of the second or grounding transistor switching element 71 is connected to the collector electrode 87 of an NPN junction transistor 88 through a diode 91 and a resistor 92. The diode 91 is connected with its cathode coupled to the base electrode 74 to reduce the leakage current through the transistor 71 in its nonconducting state to a very small value as will be explained more fully.

The transistor 88 which controls the operation of the grounding transistor includes a base electrode 89 and emitter electrode 90 connected to the negative source 82 through a pair of diodes 95 and 96. A resistor 97 is connected between the positive source 84 and the emitter electrode 90. The diodes 95 and 96 which are connected with their anodes toward the emitter 90 as shown serve to clamp the voltage at the emitter electrode 90 at a predetermined voltage slightly more positive than −12 volts independently of the current flow through the diodes.

The base 89 of the transistor 88 is connected to the emitter electrode 78 of the transistor 79 through a first timing circuit 99 consisting of a resistor 100 and a capacitor 101 connected in parallel. A second timing circuit 103 includes a resistor 104 and a capacitor 105 connected in parallel between the gate of the field effect transistor 67 and ground.

A variable low impedance resistor 106 and a resistor 107 are connected between ground and the base of grounding transistor 71. A high impedance resistor 108 is connected between the output terminal 63 and the junction of resistors 106 and 107 to compensate for the leakage current through the field effect transistor 67 in its nonconducting state. A resistor 109 is connected between the collector 87 of the transistor 88 and ground as shown and resistor 110 is connected between the positive source 84 and the anode of the diode 91. A resistor 11 is connected between the emitter 78 of the transistor 79 and the collector 73 of the transistor 71 to compensate for the resistance of the grounding transistor in its conducting state. A variable capacitance 112 is connected between the output terminal 63 and the collector 87 of the transistor 88 to compensate for the stray capacitance of the field effect transistor in its nonconducting state.

In operation the driving resistor 79 is turned on or rendered conducting by the application of the second control signal (−12 volts) at the control terminal 65. When the transistor 79 is rendered conducting the diode 76 is forward biased and a negative voltage is applied to the gate electrode 70 of the field effect transistor 67. This negative signal renders the transistor 67 nonconducting and thereby breaks the circuit between the input terminal 62 and the output terminal 63. At the same time a negative signal is applied to the junction of the timing circuit 99. This negative signal causes the capacitor 101 to discharge through the resistor 100 until the base 89 of the transistor 88 reaches a negative value sufficient to render the transistor 88 nonconducting.

It should be noted that in its conducting state the base of the transistor 88 has a negative potential of about 10 volts. The negative signal generated at the emitter 78 when the transistor 79 is conducting is delayed by the timing circuit 99 by a fraction of a microsecond so that the transistor 88 is rendered nonconducting after the transistor 79 is rendered conducting and the transistor 67 rendered nonconducting. When the transistor 88 is rendered nonconducting the base 74 of the grounding transistor 71 goes positive, forward biasing the base collector junction of the transistor 71, and causing the transistor 71 to conduct. This shorts the input terminal of the switch to ground.

Upon the application of the first control signal (0 volts) to the control terminal 65 the emitter-collector junction of the driver transistor 79 is reverse biased thereby rendering the transistor nonconducting. In this state the emitter 78 goes to approximately ground potential and reverse biases the diode 76. The timing circuit 103 maintains a negative potential on the gate electrode 70 for a fraction of a microsecond after the diode 76 is reverse biased. During this time interval in which the field effect transistor is still nonconducting, the transistor 88 is rendered conducting by the positive voltage applied to its base electrode. The collector electrode 87 is driven to approximately −10 volts which reverse biases the diode 91 and renders the transistor 71 in its nonconducting state. Thus the timing circuits 99 and 103 render the grounding transistor 71 nonconducting before the field effect transistor 67 is rendered conducting while the input terminal 62 is being switched to the amplifier input circuit 11. The timing circuits 99 and 103 also render the field effect transistors 67 nonconducting before the ground effect transistor 71 is rendered conducting while the input terminal 62 is being switched from the amplifier input circuit to ground. This prevents the amplifier input circuit from being shorted to ground which would change the output signal of the amplifier during the mode control switching time.

The undesirable inherent characteristics of the field effect and grounding transistors are compensated for in the following ways:

(1) The leakage current through the field effect transistor 67 in its nonconducting state is compensated for by the resistors 106, 107 and 108 and the positive voltage source 84 which provide a current flow through the gate and drain electrodes of the field effect transistor that is equal and opposite to the leakage current. This leakage current if not compensated for would change the current flow at the summing junction connected to the amplifier input circuit and provide an error in the output voltage $e_0$.

(2) The resistors 111, 75 and the source of negative potential at the emitter of the driving transistor 79 in its conducting state compensate for the voltage drop in the grounding transistor 71 in its conducting state. This drops the collector voltage of the grounding transistor 71 to a voltage slightly below ground to compensate for the impedance of the grounding transistor in its conducting state.

(3) The diode 91 and resistors 107 and 106 compensate for the leakage current through the grounding transistor 71 in its nonconducting state. In this condition the diode 91 is reverse-biased which provides a very high impedance to current flow. The diode 91 and the resistors 107 and 106 form a voltage divider which provides a very low voltage at the base 74 and virtually eliminates leakage current through the base of the resistor 71.

(4) The capacitor 112 is connected between the output terminal 63 and the collector of the transistor 88 which is at approximately −10 volts when the transistor 88 is in its conducting state. The capacitor 112 and the negative voltage source balances the stray capacitance of the field transistor 67 in its nonconducting state and thus compensates for switching voltage transients.

As discussed in connection with FIG. 1 it is necessary to provide control signals to the reset, operate and hold mode control switches so that the input terminal of at least one switch is always connected to the input circuit 11 of the amplifier 10. This can be accomplished by overlapping the first control signals to two of the switches by a small time interval, for example, a half a microsecond, or it can be accomplished by utilizing a timing circuit connected to the control terminal of each switch. Such a timing circuit is designated by the reference numeral 115 in the circuit of FIG. 2. The timing circuit 115 comprises a resistor 116 and a capacitor 117 connected in parallel between the control terminal 65 and the negative terminal of a battery 118 designated as a −12 volt source. A diode 119 is also included in the timing circuit with its cathode connected to the base electrode 80.

The timing circuit 115 serves to delay the application of the second control signal to the base of the driving transistor 79 to insure that the field effect transistor of the switch that is being turned off is not rendered nonconducting until the field effect transitsor of the switch being turned on is rendered conducting.

With the first control signal (zero volts) being applied to the terminal 120, the diode 119 is forward biased and the transistor 79 is nonconducting. The base electrode 80 of the transistor 79 and terminal 65 are approximately at ground potential or zero volts. The field effect transistor 67 is conducting at this time and the input terminal 62 is connected to the amplifier input circuit 11. In this state of operation a voltage of approximately 12 volts is applied across the capacitor 117 and the capacitor accumulates a charge proportional to this voltage.

Upon the application of the second control signal (−12 volts) to the terminal 120 the diode 119 is reverse biased. The base-emitter junction of the transistor 79 does not, however, immediately assume a forward biased condition because of the charge stored on the capacitor 117. The charge on the capacitor 117 is discharged through the resistor 116 thereby providing a delay in the application of the necessary negative signal to the base electrode 80 to render the transistor 79 conducting. The application of the first control signal to the terminal 125 immediately turns the driving transistor 79 off and turns the field effect transistor on just after the grounding transistor 71 is turned off. By means of the timing circuit 115 the simultaneous application of a first and second control signal to two mode control switches to change the input signal to the amplifier 10 will turn the switch that was previously in the off condition to its on condition before changing the state of the switch that was in the on condition. Thus two mode control switches are always on for a brief time interval of the order of one half of a microsecond during the time period when one switch is being turned off and another switch is being turned on.

Operational amplifier circuits with mode control switches in accordance with the present invention have proved to be highly accurate and reliable.

What is claimed is:

1. In an operational amplifier circuit the combination which comprises:

(a) an operational amplifier having an input circuit and an output circuit, (b) first and second amplifier input terminals for receiving input signals to be selectively applied to the amplifier input circuit, (c) a plurality of mode control switches (d) each mode control switch having an input terminal, first and second output terminals and a control terminal and being arranged to selectively connect the input terminal thereof to the first and second output terminals in response to the application of first and second control signals, respectively, to the control terminal, (e) the first output terminal of each switch being connected to the input circuit of the amplifier, (f) the second output terminal of each switch being connected to ground potential, (g) a separate feedback impedance connected between the amplifier output circuit and the input terminals of the first and second switches, (h) an input impedance connected between the first amplifier input terminal and the input terminal of the first switch, (i) an input impedance connected between the second amplifier input terminal and the input terminal of the second switch and (j) means for applying the first control signal to the control terminal of a selected mode control switch and the second control signal to the control terminals of the other mode control switches and for simultaneously applying the first control signal to the control terminals of two of the switches during the transition time when the input terminals of said two switches are being disconnected from one of the output terminals and connected to the other output terminal so that the input circuit of the amplifier is always connected to at least one of the input terminals of the switches.

2. The combination as defined in claim 1 wherein each mode control switch comprises (a) a first transistor connected between the input terminal and the first output terminal thereof, (b) a second transistor connected between the input terminal and the second output terminal and (c) timing means coupled to the first and second transistors and responsive to the control signals applied to the control terminal of the switch for rendering the second transistor in its nonconducting state and subsequently the first transistor in its conducting state in response to the first control signal and for rendering the first transistor in its nonconducting state and subsequently the second transistor in its conducting state in response to the second control signal.

3. The combination as defined in claim 2 wherein the timing means includes a parallel connected resistance and capacitance network coupled individually to each of the first and second transistors.

4. The combination as defined in claim 2 wherein the means for applying the control signals to the control terminals of the mode control switches includes (a) a source of control signals for producing the first and second control signals, (b) a timing circuit comprising a resistor and capacitor connected between the control terminal of each switch and a source of potential and (c) a diode connected between the junction of the timing circuit and the control terminal of each switch and the source of control signals for delaying the application of the second control signal to each mode control switch.

5. The combination as defined in claim 2 including (a) a high impedance resistor and a source of potential connected to the first output terminal of the switch for providing a current flow through the first transistor which is substantially equal and opposite to the leakage current therethrough when the first transistor is in its nonconducting state, (b) a resistor connected in series between ground and the second transistor and the input terminal of the switch and (c) a source of potential connected to the junction of the last named resistor and the second transistor for providing a current flow through said resistor to compensate for the voltage drop across the second transistor in its conducting state to maintain the input terminal of the switch at substantially ground potential when the second transistor is in its conducting state.

6. The combination as defined in claim 5 including (a) a diode and resistance means coupled to the second transistor to compensate for leakage current through the second transistor in its nonconducting state and (b) capacitance means and a source of potential coupled to the first output terminal of the switch to compensate for the stray capacitance of the first transistor in its nonconducting state.

7. The combination as defined in claim 1 wherein each mode control switch comprises:

(a) a field effect transistor connected between the input terminal and the first output terminal thereof and ground, (b) a grounding transistor connected between the input terminal and the second output terminal, (c) a third transistor coupled to the field effect transistor for controlling the state of conduction of the field effect transistor in response to the application of the first and second control signals to the control terminal, (d) a fourth transistor coupled to the grounding transistor for controlling the state of conduction of the grounding transistor in response to the state of conduction of the third transistor, (e) a first timing circuit coupled between the third and fourth transistors for delaying the signal applied to the fourth transistor and the grounding transistor upon the application of the second control signal to render the grounding transistor conducting after the field effect transistor is rendered nonconducting, and (f) a second timing circuit comprising a parallel resistance and capacitance network coupled to the field effect transistor for delaying the signal that renders the field effect transistor conducting until after the grounding transistor is rendered nonconducting.

8. In an operational amplifier circuit the combination which comprises, (a) an operational amplifier having an input circuit and an output circuit, (b) first and second amplifier input terminals for receiving input signals to be selectively applied to the amplifier input circuit, (c) a separate reset, operate and hold control switch, (d) each mode control switch having an input terminal, first and second output terminals and a control terminal and being arranged to selectively connect the input terminal thereof to the first and second output terminals in response to the application of predetermined control signals to the control terminal, (e) the first output terminal of each switch being connected to the input circuit of the amplifier, (f) the second output terminal of each switch being connected to ground potential, (g) a separate feedback impedance connected between the amplifier output circuit and the input terminals of the reset and operate switches, (h) an input impedance connected between the first amplifier input terminal and the input terminal of the reset switch, (i) an input impedance connected between the second amplifier input terminal and the input terminal of the operate switch, (j) capacitance means coupled between the amplifier output circuit and the input terminal of the hold switch and (k) means for applying control signals to the control terminal of a selected mode control switch to connect the input terminal thereof to the input circuit of the amplifier and for applying control signals to the control terminals of the other mode control switches to connect the input terminals thereof to ground, (l) the last named means including timing means for simultaneously connecting the input terminals of two of the mode control switches to the input circuit of the amplifier during the transition time when the mode of operation of the two switches is being changed.

9. The combination as defined in claim 8 wherein each mode control switch comprises (a) a first transistor connected between the input terminal and the first output terminal therof, (b) a second transistor connected between the input terminal and the second output terminal thereof and (c) timing means coupled to the first and second transistors and responsive to the control signals applied to the control terminal of the switch for rendering a second transistor in its nonconducting state and subsequently the first transistor in its conducting state when the input terminal is being connected to the first output terminal thereof and for holding the first transistor in its nonconducting state and subsequently the second transistor in its conducting state when the input terminal is being connected to the second output terminal thereof.

10. In a mode control switch for selectively coupling a signal from an input source to the input circuit of an amplifier or to ground potential in response to first and second predetermined control signals, respectively, the combination which comprises, (a) an input terminal, and first and second output terminals and a control terminal for receiving the predetermined control signals (b) the input terminal being adapted to be connected to the input source (c) the first output terminal being adapted to be connected to the input circuit of the amplifier, (d) the second output terminal being adapted to be connected to ground potential, (e) a field effect transistor connected between the input terminal and the first output terminal for connecting the input terminal to the first output terminal thereof when the field effect transistor is in a conducting state (f) a second transistor connected between the input terminal and the second output terminal for connecting the input terminal to the second output terminal thereof when the second transistor is in a conducting state, and (g) a control circuit coupled between each of the transistors and the control terminal for applying a signal to selectively turn the second transistor to its nonconducting state and then turn the field effect transistor to its conducting state in response to the first control signal and to turn the field effect transistor to its nonconducting state and then turn the second transistor to its conducting state in response to the second control signal.

11. The mode control switch as defined in claim 10 including resistance means and a source of potential connected to the first output terminal for providing a current flow through the field effect transistor in its nonconducting state which is subsequently equal and opposite to the leakage current through the field effect transistor in its nonconducting state.

12. The combination as defined in claim 11 including capacitance means and a source of potential connected to the first output terminal to compensate for the stray capacitance of the field effect transistor in its nonconducting state.

13. The combination as defined in claim 10 including a resistor connected in series between ground potential and the second transistor and a source of potential connected to the junction of the resistor and the second transistor for providing a current flow through the resistor to compensate for the voltage drop across the second transistor in its conducting state to maintain the input terminal of the switch at substantially the potential of the second output terminal when the second transistor is in its conducting state.

14. The combination as defined in claim 10 including a diode and a resistor coupled to the second transistor to compensate for leakage current through the second transistor in its nonconducting state.

15. In a mode control switch for selectively coupling a signal from an input source to the input circuit of an amplifier or to ground potential in response to first and second predetermined control signals, respectively, the combination which comprises (a) an input terminal, first and second output terminals and a control terminal for receiving the control signals (b) the input terminal being adapted to be connected to the input source (c) the first output terminal being adapted to be connected to the input circuit of the amplifier (d) the second output terminal being adapted to be connected to ground potential (e) a first transistor having first, second and third electrodes, and arranged so that the current flow through the first and second electrodes is controlled by a voltage applied to the third electrode relative to the first or second electrodes thereof, the first and second electrodes being connected in series between the input terminal and the first output terminal, (f) a second transistor having first, second and third electrodes, and being arranged so that the current flow through the first and second electrodes is controlled by a voltage applied to the third electrode relative to the voltage of the first or second electrodes thereof, (g) the first and second electrodes of the second transistor being connected in series between the input terminal and the second output terminal, and (h) a control circuit coupled between the control terminal and the third electrodes of each transistor for rendering the first and second transistors alternately conducting in response to the first and second control signals, respectively, (i) the control circuit including a first diode connected to the third electrode of the first transistor and arranged to be forward biased in response to the application of the second control signal for rendering the first transistor nonconducting (j) the control circuit including a first timing circuit responsive to the application of the second control signal for rendering the second transistor conducting after the first transistor is rendered nonconducting, (k) the control circuit including a second timing circuit connected between the junction of the first diode and the third electrode of the first transistor and the second output terminal for rendering the first transistor conducting after the second transistor is rendered nonconducting in response to the application of the first control signal.

16. The mode control switch as defined in claim 15 wherein (a) the first transistor is a field effect transistor with the first, second and third electrodes being the source, drain and gate electrodes, respectively, and (b) the second transistor is a junction transistor with the first, second and third electrodes being the collector, emitter and base electrodes, respectively, and further including (c) a resistor and a source of potential connected to the first output terminal for providing a current flow through the field effect transistor which is equal and opposite to the leakage current through the field effect transistor in its nonconducting state (d) a capacitor and a source of potential connected to the first output terminal to compensate for the stray capacitance of the field effect transistor in its nonconducting state, and (e) a diode and resistor coupled to the base of the junction transistor to compensate for leakage current through the second transistor in its nonconducting state.

References Cited

UNITED STATES PATENTS

| | | | |
|---|---|---|---|
| 3,140,408 | 7/1964 | May | 307—88.5 |
| 3,231,723 | 1/1966 | Gilliland et al. | 235—183 X |
| 3,249,925 | 5/1966 | Single et al. | 235—183 X |

JOHN S. HEYMAN, *Primary Examiner.*

ARTHUR GAUSS, *Examiner.*